US008884359B2

(12) United States Patent
Grimaldi et al.

(10) Patent No.: US 8,884,359 B2
(45) Date of Patent: Nov. 11, 2014

(54) FIELD-EFFECT TRANSISTOR WITH SELF-LIMITED CURRENT

(75) Inventors: Antonio Giuseppe Grimaldi, S. Giovanni la Punta (IT); Salvatore Pisano, Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 38 days.

(21) Appl. No.: 12/748,178

(22) Filed: Mar. 26, 2010

(65) Prior Publication Data
US 2010/0244123 A1 Sep. 30, 2010

(30) Foreign Application Priority Data
Mar. 26, 2009 (IT) .............................. MI2009A0474

(51) Int. Cl.
*H01L 29/66* (2006.01)
*H01L 29/78* (2006.01)
*H01L 29/06* (2006.01)
*H01L 29/08* (2006.01)
*H01L 29/10* (2006.01)

(52) U.S. Cl.
CPC ........ *H01L 29/7802* (2013.01); *H01L 29/0634* (2013.01); *H01L 29/0878* (2013.01); *H01L 29/66712* (2013.01); *H01L 29/0886* (2013.01); *H01L 29/1095* (2013.01)
USPC ....... 257/328; 257/E21.41; 257/329; 438/268

(58) Field of Classification Search
USPC ............. 257/329, E21.41, E29.262, E21.418; 438/268
See application file for complete search history.

(56) References Cited

U.S. PATENT DOCUMENTS
5,747,841 A 5/1998 Ludikhuize
6,459,108 B1 10/2002 Bartsch et al.
(Continued)

FOREIGN PATENT DOCUMENTS
JP 2003101022 A 4/2003

OTHER PUBLICATIONS
Italian Search Report dated Mar. 26, 2009, from corresponding Italian Application No. MI20090474.
(Continued)

*Primary Examiner* — Wensing Kuo
*Assistant Examiner* — Shaka White
(74) *Attorney, Agent, or Firm* — Allen, Dyer, Doppelt, Milbrath & Gilchrist, P.A.

(57) ABSTRACT

A field-effect transistor is integrated in a chip of semiconductor material of a first type of conductivity, which has a first main surface and a second main surface, opposite to each other. The transistor includes a plurality of body regions of a second type of conductivity, each one extending from the second main surface in the chip. A plurality of drain columns of the second type of conductivity are provided, each one extending from a body region towards the first main surface, at a pre-defined distance from the first main surface. A plurality of drain columns are defined in the chip, each one extending longitudinally between a pair of adjacent drain columns. The transistor includes a plurality of source regions of the first type of conductivity, each one of them extending from the second main surface in a body region; a plurality of channel areas are defined, each one in a body region between a source region of the body region and each drain channel adjacent to the body region. There are then provided a gate terminal extending over the cannel areas (with the gate terminal that is insulated from the second main surface), a source terminal contacting the source regions on the second main surface, and a drain terminal contacting the chip on the first main surface. In the transistor according to an embodiment of the invention, each drain channel includes a first residual portion having a first transversal width and a second prevalent portion having a second transversal width higher than the first transversal width.

39 Claims, 14 Drawing Sheets

(56) References Cited

U.S. PATENT DOCUMENTS

| | | |
|---|---|---|
| 2001/0052601 A1 | 12/2001 | Onishi et al. |
| 2004/0009643 A1* | 1/2004 | Blanchard .................... 438/268 |
| 2004/0150039 A1* | 8/2004 | Henson ........................ 257/330 |
| 2005/0029581 A1 | 2/2005 | Deboy et al. |
| 2006/0131644 A1 | 6/2006 | Saito et al. |
| 2006/0194391 A1* | 8/2006 | Saggio et al. ................ 438/268 |
| 2009/0085064 A1* | 4/2009 | Rueb et al. .................... 257/194 |
| 2009/0166722 A1* | 7/2009 | Hebert .......................... 257/328 |

OTHER PUBLICATIONS

Written Opinion dated Jul. 2008, from corresponding Italian Application No. MI20090474.

* cited by examiner

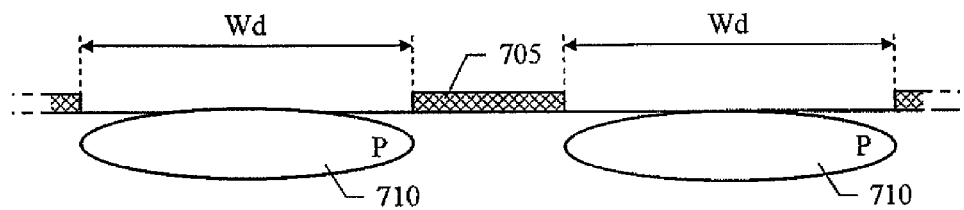
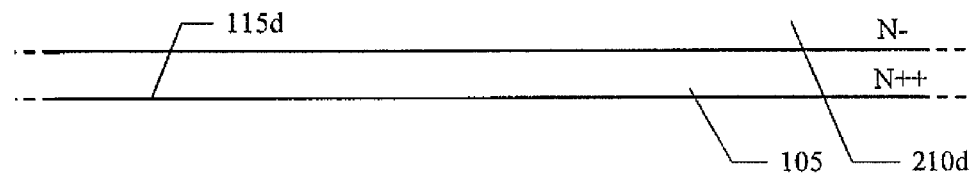
FIG.7A
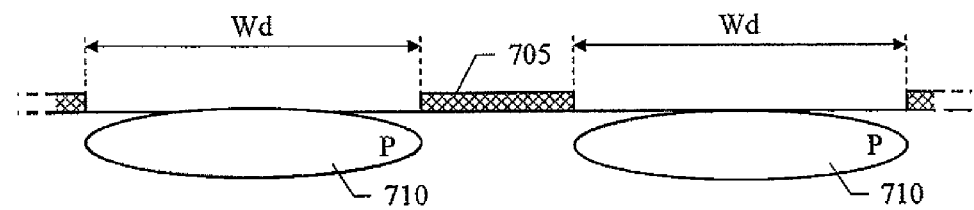
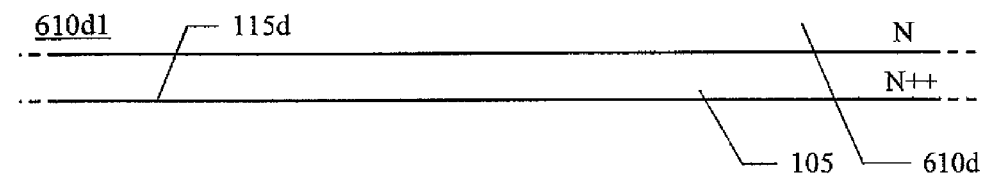
FIG.7A'

FIELD-EFFECT TRANSISTOR WITH SELF-LIMITED CURRENT

CROSS REFERENCE TO RELATED APPLICATIONS

This application claims the priority benefit of Italian patent application number MI2009A000474, filed on Mar. 26, 2009, entitled "FIELD-EFFECT TRANSISTOR WITH SELF-LIMITED CURRENT," which is hereby incorporated by reference to the maximum extent allowable by law.

BACKGROUND OF THE INVENTION

1. Field of the Invention

The solution according to embodiments of the present invention relates to the field of the integrated circuits. More specifically, this solution concerns field-effect transistors.

2. Discussion of the Related Art

Field-effect transistors are usually used in various applications; in particular, power field-effect transistors (such as the power MOSFETs, or simply power MOSs) are suitable for the use in industrial applications (for example, for controlling motors).

For this purpose, power MOSs need to be able to withstand high voltages (for example, up to 50-2.000V) and supply high currents (for example, up to 1-100 A). This result is obtained by suitably controlling various features of the power MOSs; in particular, the main parameters that define each power MOS performance are the breakdown voltage (BV) and the output resistance in ON state (Ron).

The breakdown voltage is the voltage that breaks a drain junction (being reverse biased) of the power MOS—hence the BV needs to be maintained high so that the power MOS can withstand the desired voltage. The output resistance is instead the resistance between a source region and a drain region of the power MOS in its linear operating region—hence the output resistance needs to be maintained low so that the power MOS can supply the desired current (without large power losses and heat dissipations). These features are generally in contrast to each other—since high breakdown voltages require to make the MOS transistor in a thick and low-doped epitaxial layer (to have a larger depletion area of the drain junction), while low output resistances require a thin and highly-doped epitaxial layer.

Various solutions have been suggested in an attempt to attenuate the above-mentioned problem. For example, in the last years so called multi-drain (or superjunction) power MOSs have been proposed, which have a very low output resistance even maintaining a very high breakdown voltage. This result is obtained by extending each body region of the power MOS with a drain column (of the same type of conductivity), so as to form drain channels in the epitaxial layer between each pair of adjacent drain columns. This structure distributes an electric field at the drain junction of the power MOS along the drain columns, so that the field is laterally widened; this remarkably increases the breakdown voltage of the power MOS for the same doping of the epitaxial layer (on the contrary, allowing remarkably increasing the doping of the epitaxial layer, and then reducing the output resistance, for the same breakdown voltage).

However this reduction of the output resistance causes a corresponding increase of a saturation current of the power MOS—defined as a constant current supplied by the power MOS in its saturation region, when a voltage that causes the closure of its channel is reached.

For example, the multi-drain power MOSs can have saturation currents 2-5 times higher than the standard power MOSs have (with values up to some hundreds of Ampere).

This may be a serious drawback in limit operating conditions of the power MOS (for example, caused by malfunctioning in a system wherein it is used). A typical scenario is a short-circuit of a load that is driven by the power MOS. In fact, in this situation, the voltage at the power MOS reaches the supply voltage of the system (for example 100-200V), so that the current that crosses it reaches the value of the saturation current (for example, 50-100 A). The corresponding power that has to be dissipated by the power MOS (i.e. 5-20 kW) may cause its breakdown very quickly (in the order of a few ns).

The solution normally used to solve this problem is to connect a current limiter in series to the power MOS.

The current limiter can be of the passive type—wherein the current is automatically limited, so as to obtain an intrinsically safe behavior. In this case, the current limiter is generally made through a component that acts as a resistor with low resistance in a pre-defined range up to a threshold voltage (so as to limit the power loss in normal operating conditions), and as a current generator beyond the threshold voltage (so as to maintain a constant current). On the contrary, in a current limiter of the active type the current is continuously monitored so as to limit the current when it reaches a danger value (so as to avoid any power loss in normal operating conditions).

For example, the current limiters can be implemented by exploiting a conduction channel delimited by regions of opposite type of conductivity. The current flowing in the conduction channel reverse biases a corresponding PN junction; this limits the width of the conduction channel (thereby increasing its resistance), until the conduction channel is completely closed (with the current that remains constant). For example, U.S. Pat. No. 5,747,841 describes a current limiter based on a MOS transistor with a gate terminal left floating or short-circuited to one of its source terminals; U.S. Pat. No. 6,459,108 instead describes a current limiter made in a chip wherein there are provided two floating regions of opposite type of conductivity that define a lateral channel.

In any case, the known solutions need the addition of a further device to the system wherein the power MOS is used; this increases the area and the complexity of the system. Besides, a possible protection device of the power MOS (used to activate the current limiter when the current reaches the danger value) must have a very quick intervention time (for example, of the order of a few ns) to avoid the breakdown of the power MOS caused by its high saturation current; this increases the cost of the device and hence the cost of the whole system.

In its general terms, the solution according to embodiments of the present invention is based on the idea of making a field-effect transistor with self-limited current.

Particularly, different aspects of the solution according to embodiments of the invention are set out in the independent claims. Advantageous features of the same solution are indicated in the dependent claims.

SUMMARY OF THE INVENTION

More specifically, an aspect of a solution according to an embodiment of the invention includes a field-effect transistor. The transistor is integrated in a chip of semiconductor material of a first type of conductivity, which has a first main surface and a second main surface, opposite to each other. The transistor has a plurality of body regions of a second type of conductivity, each one extending from the second main surface in the chip. A plurality of drain columns of the second type of conductivity are provided, each one extending from a body region towards the first main surface, at a pre-defined distance from the first main surface. A plurality of drain columns are defined in the chip, each one extending longitudinally between a pair of adjacent drain columns. Besides the transistor includes a plurality of source regions of the first type of conductivity, each one of them extending from the second main surface in a body region; a plurality of channel areas are defined, each one in a body region between a source region of the body region and each drain channel adjacent to the body region. There are then provided a gate terminal extending over the cannel areas (with the gate terminal that is insulated from the second main surface), a source terminal contacting the source regions on the second main surface, and a drain terminal contacting the chip on the first main surface. In the transistor according to an embodiment of the invention, each drain channel has a first residual portion having a first transversal width and a second prevalent portion having a second transversal width higher than the first transversal width.

Another aspect of the solution according to an embodiment of the invention includes a method for making such a field-effect transistor.

A further aspect of the solution according to an embodiment of the invention includes a system that includes one or more of these field-effect transistors.

BRIEF DESCRIPTION OF THE DRAWINGS

The solution according to embodiments of the invention, as well as further features and the advantages thereof, will be best understood with reference to the following detailed description, given purely by way of a non-restrictive indication, to be read in conjunction with the accompanying figures (wherein corresponding elements are denoted with equal or similar references, and their explanation is not repeated for the sake of exposition brevity).

In this respect, it is expressly intended that the figures are not necessarily drawn to scale (with certain details that may be exaggerated and/or simplified) and that, unless otherwise indicated, they are merely used to conceptually illustrate the structures and the procedures described herein.

Figure 1:
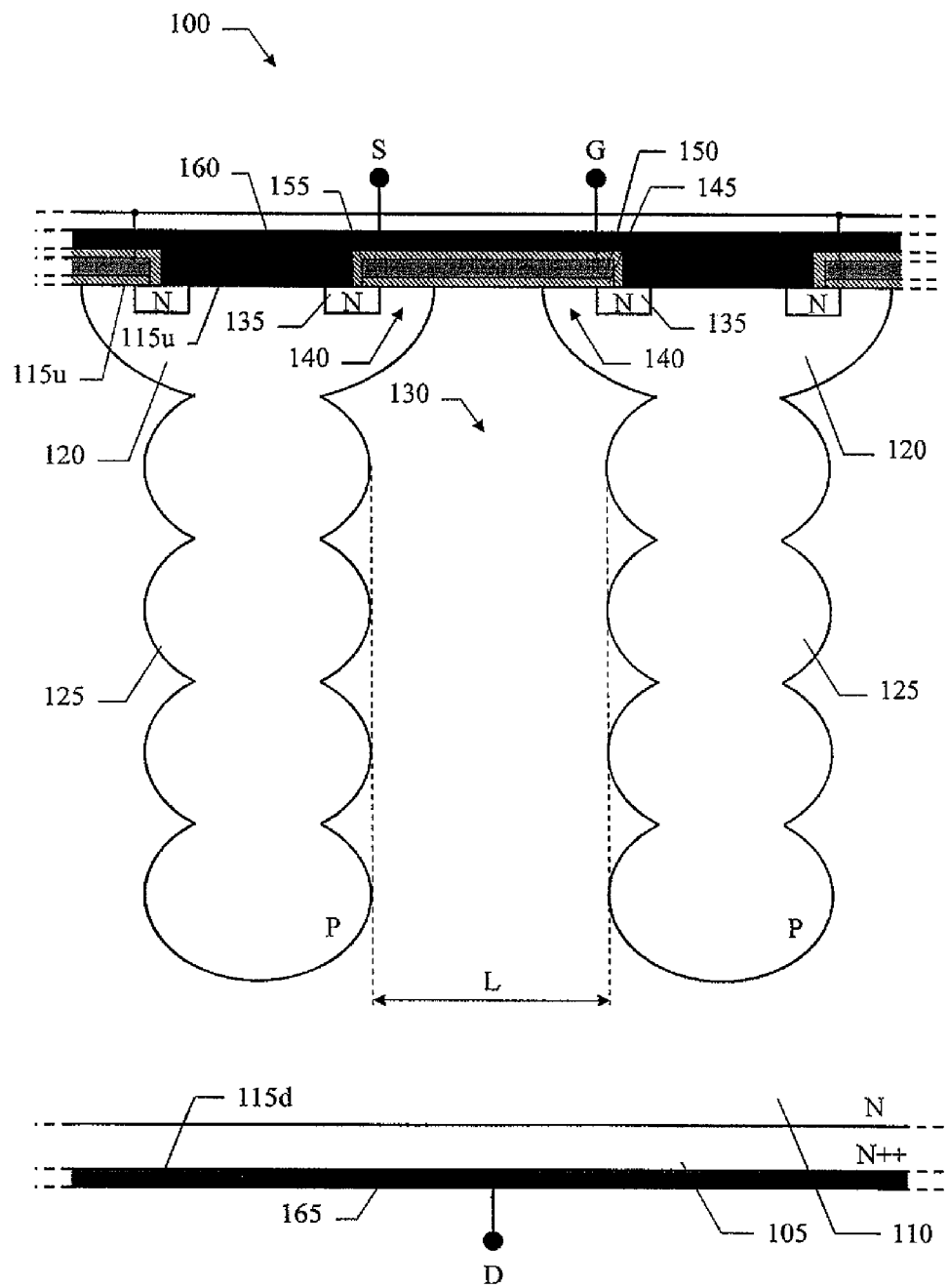
Figure 2A:
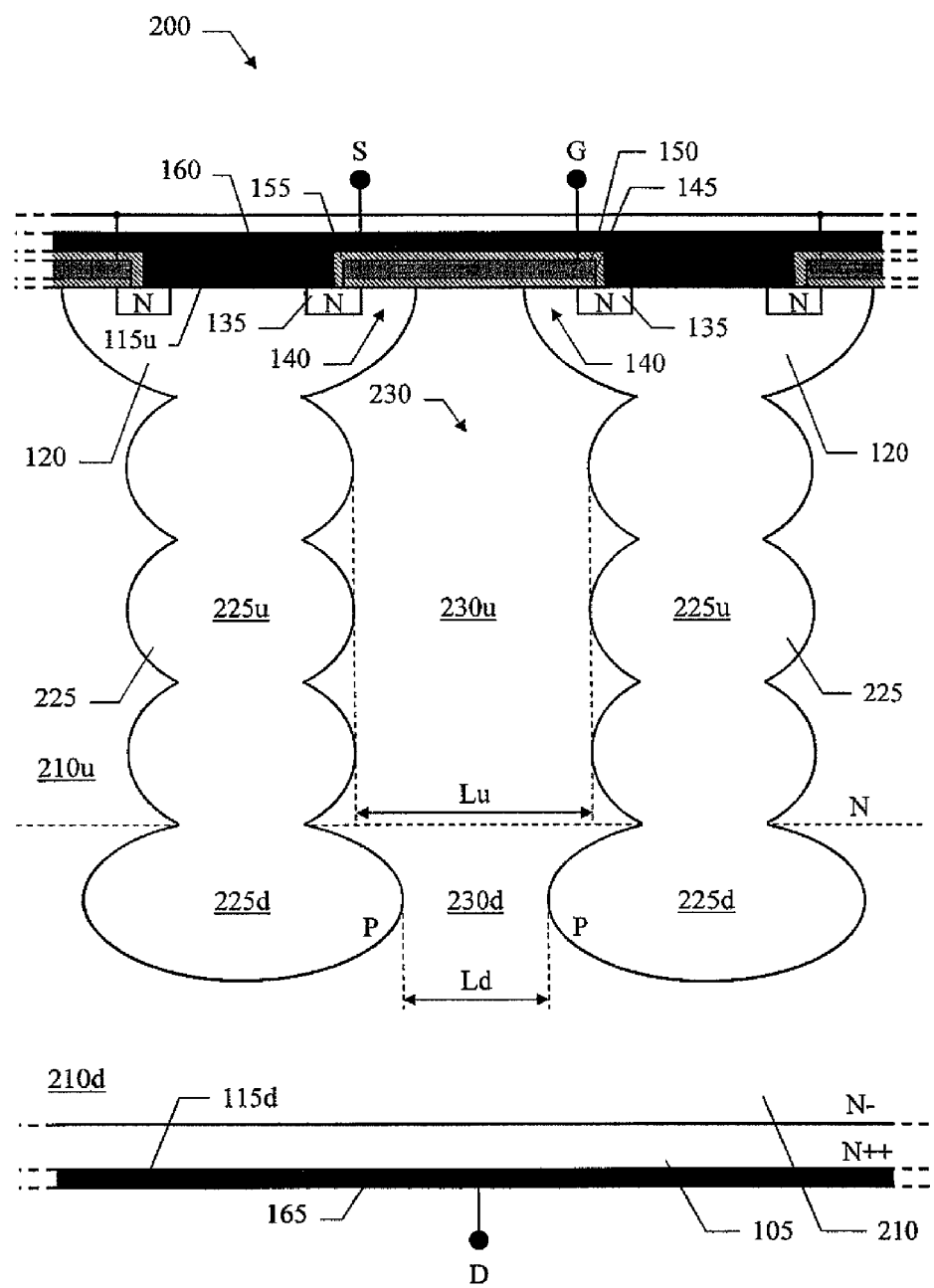
Figure 2B:
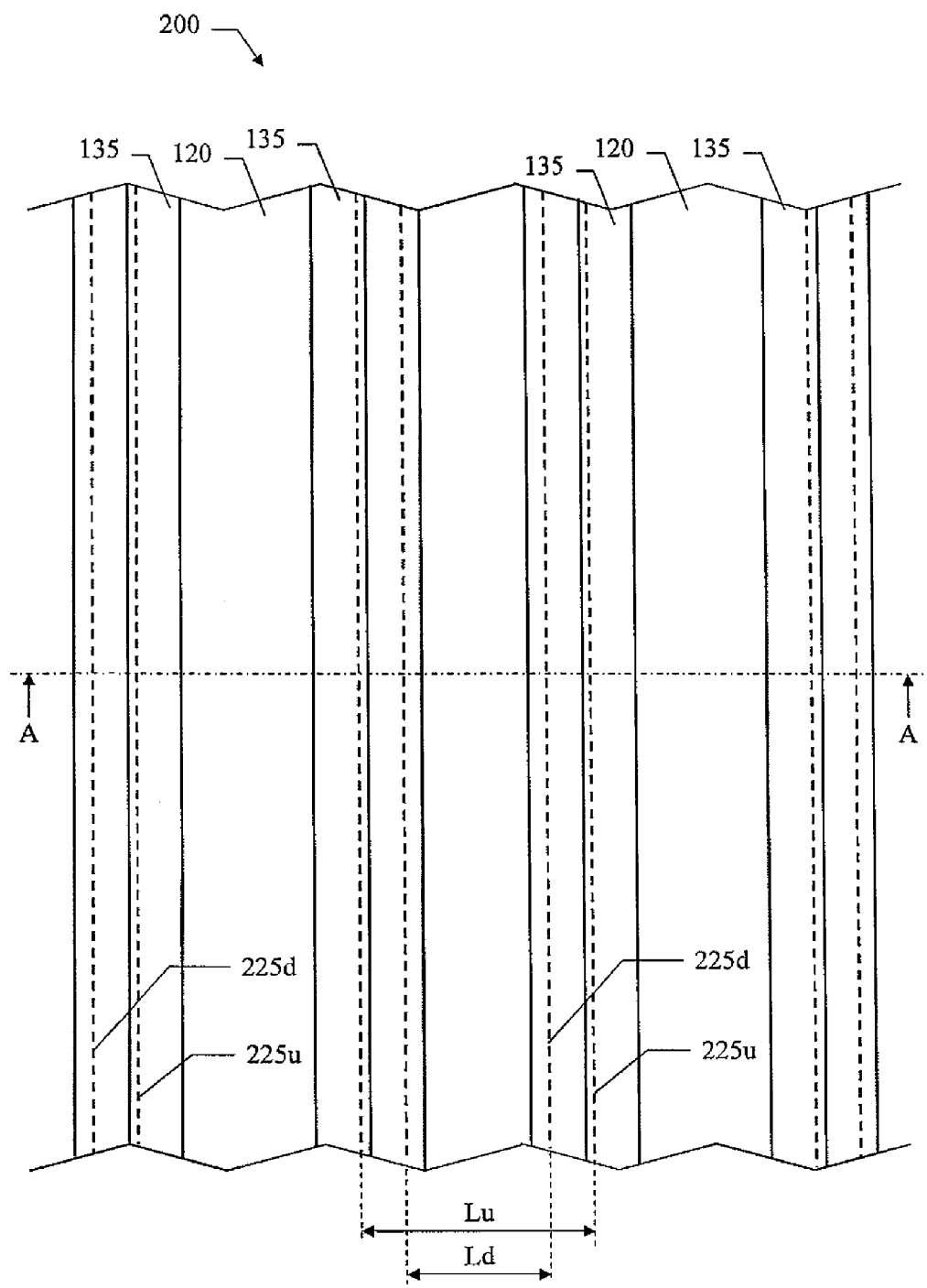
Figure 2C:
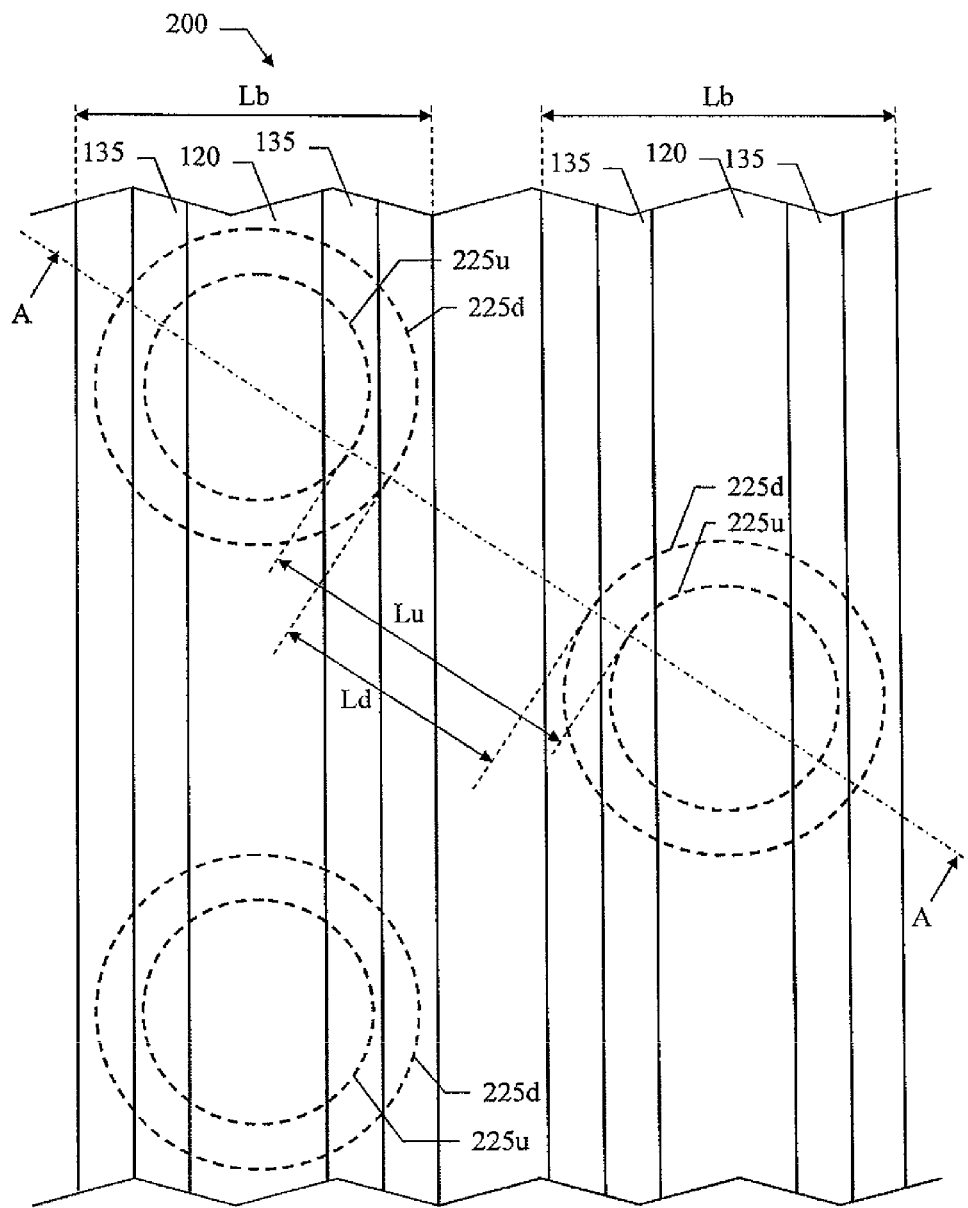
Figure 4A:
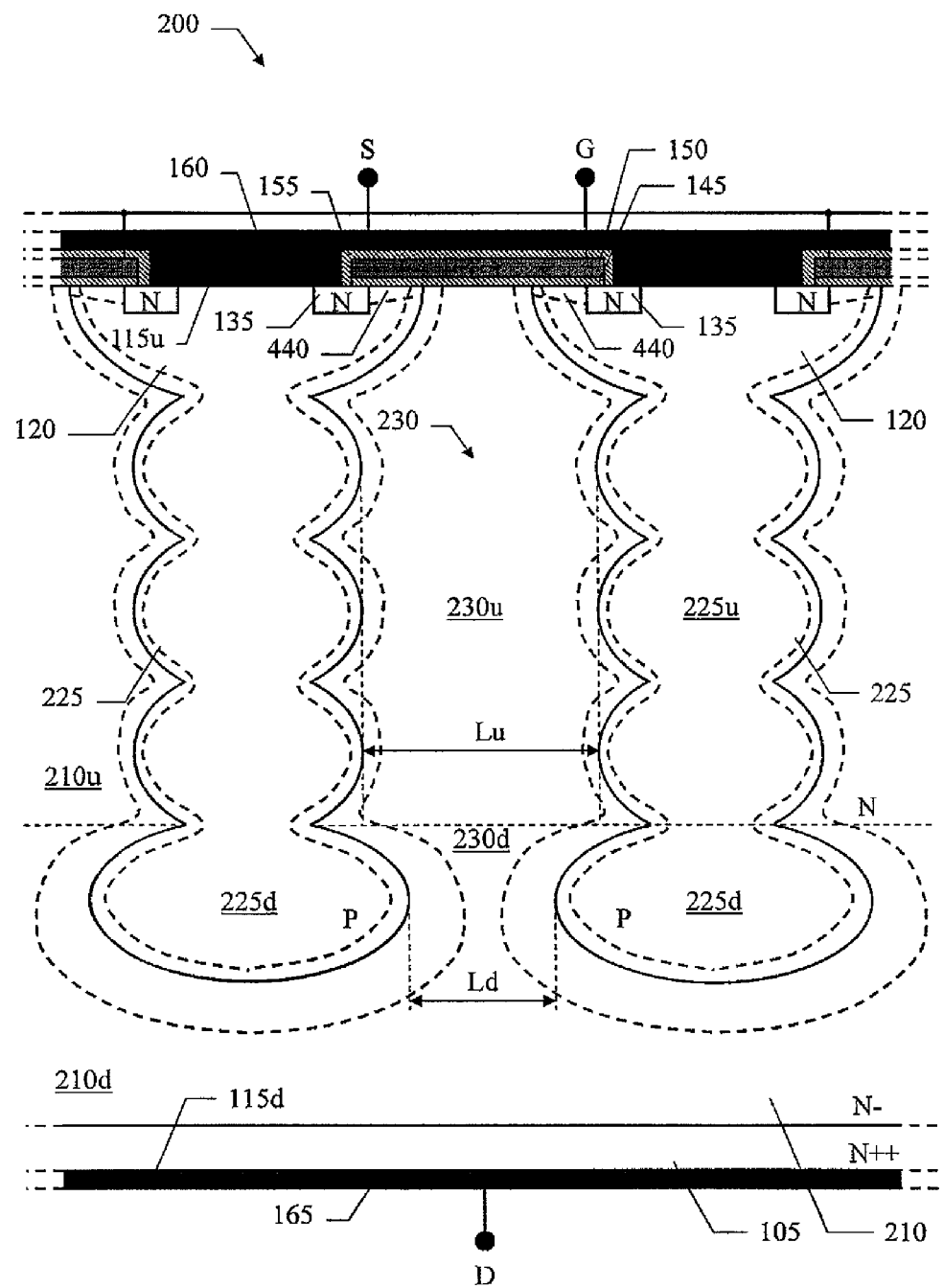
Figure 4B:
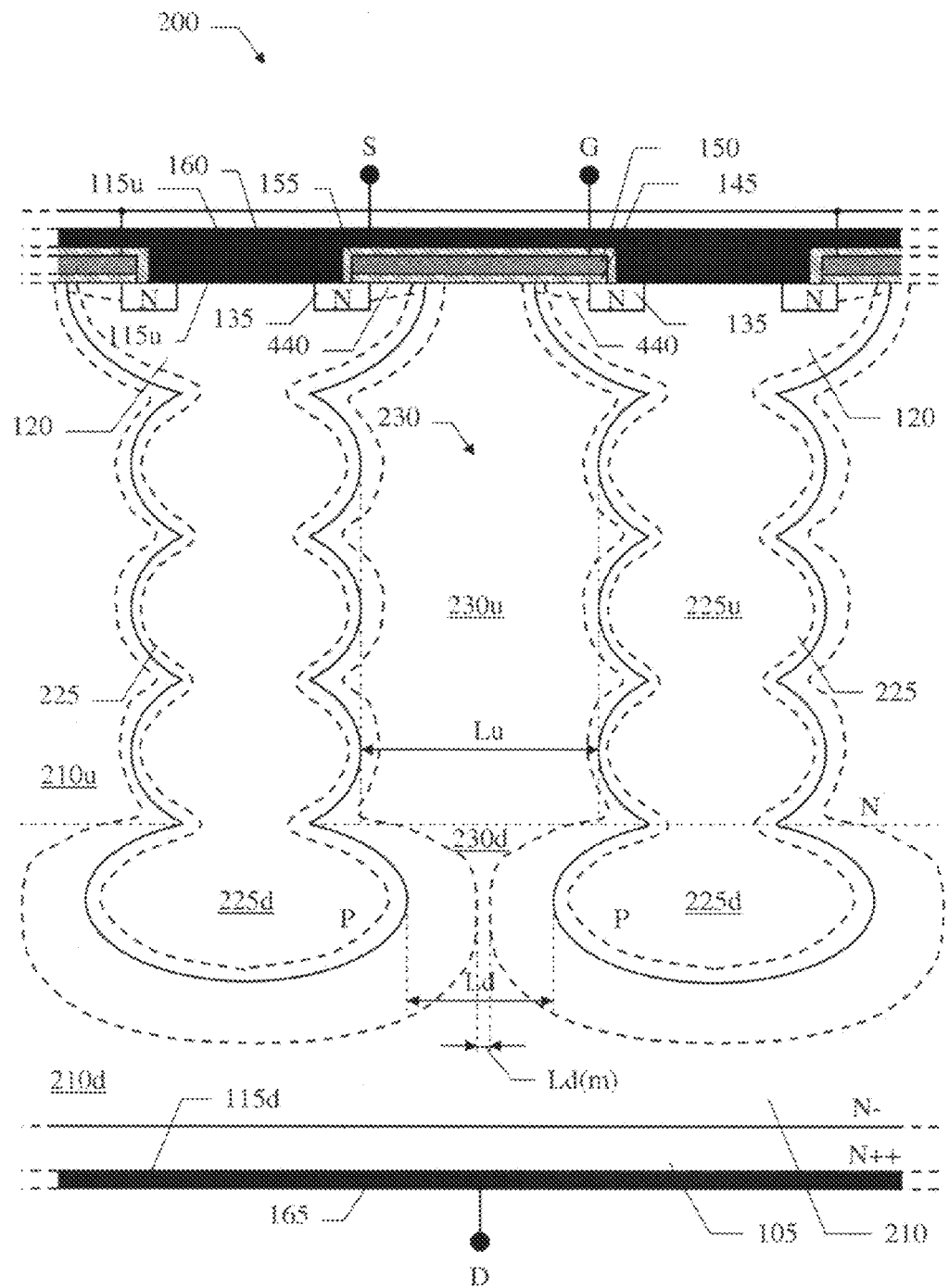
Figure 5:
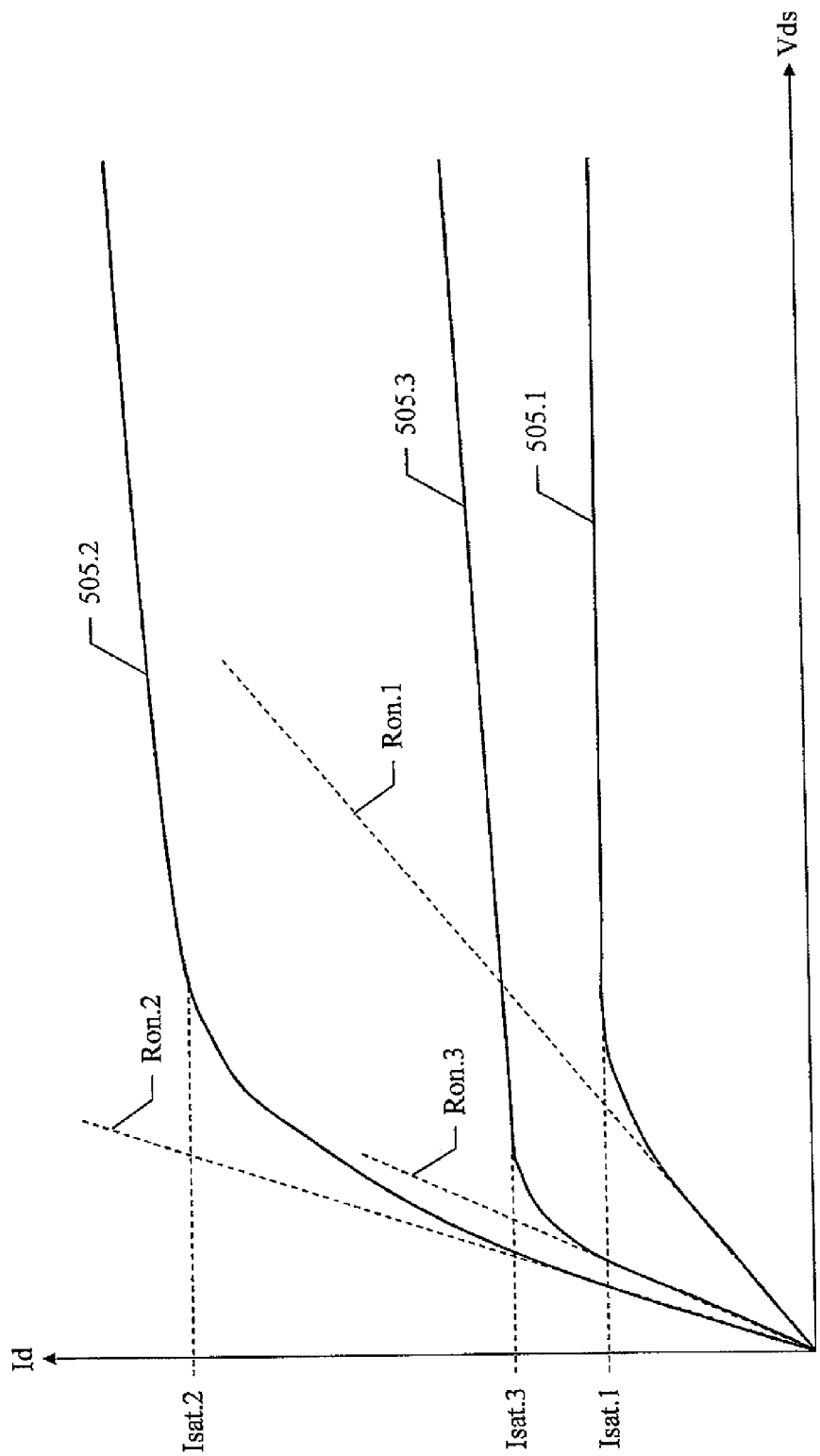
Figure 6:
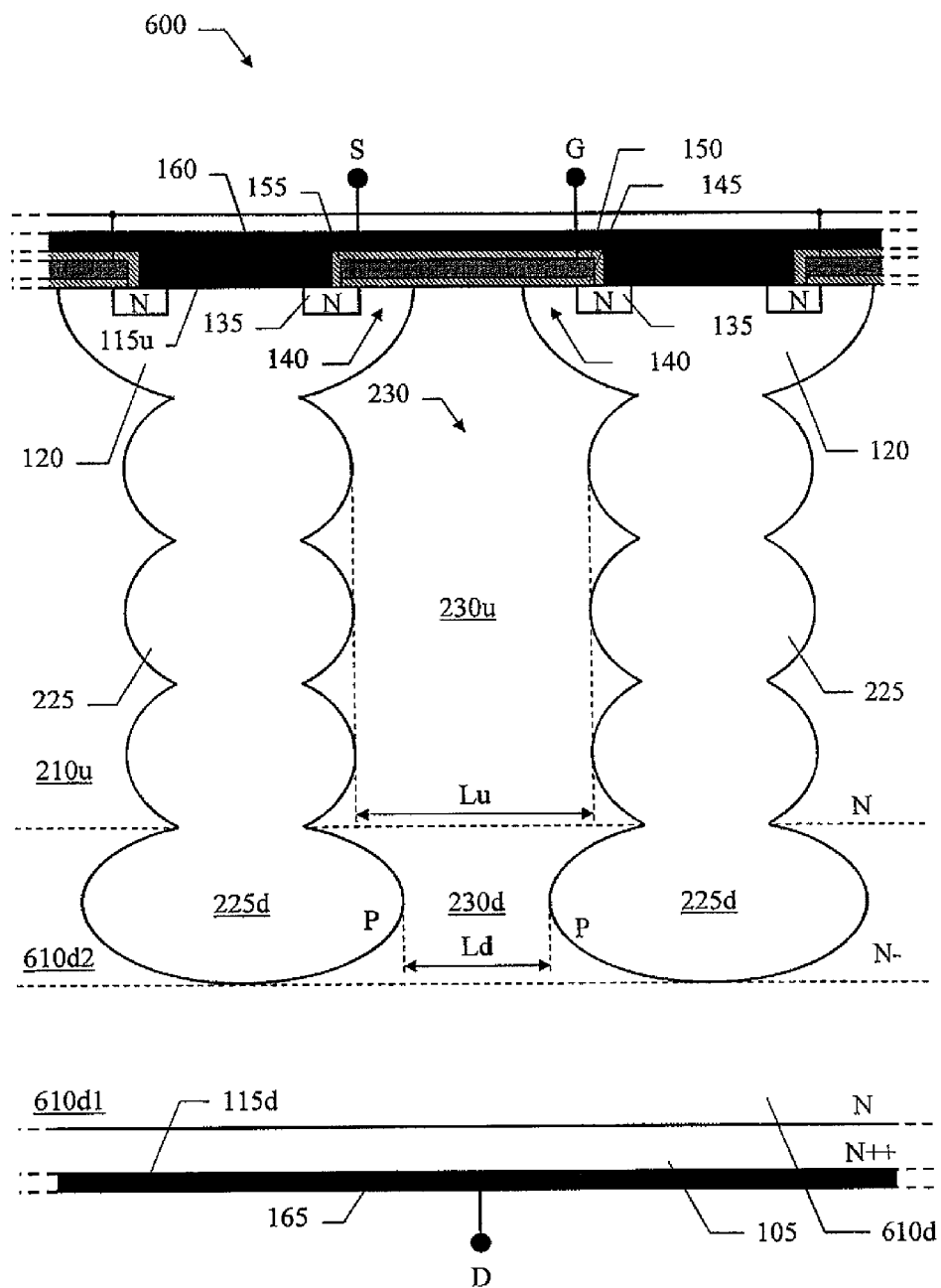

In particular:

FIG. 1 is a partial view in cross-section of a power MOS known in the art,

FIG. 2A is partial view in cross-section of a power MOS according to an embodiment of the invention, FIG. 2B-2C are plan views with removed parts of the power MOS of FIG. 2A, FIG. 4A-4B show the power MOS of FIG. 2A in different operating conditions, FIG. 5 is a comparative graph of an exemplary output characteristic of different power MOSs, FIG. 6 is a partial view in cross-section of a power MOS according to another embodiment of the invention, and FIGS. 7A,7A'-7F show the main steps of a production process of the power MOS according to an embodiment of the invention.

DETAILED DESCRIPTION

In particular with reference to FIG. 1, there is shown a partial view in cross-section of a power MOS 100 (of the multi-drain type) known in the art. Typically, the same integrated structure is formed in large numbers in several identical areas of a wafer of semiconductor material, which are subsequently separated by cutting operation. As usual, the concentrations of N-type and P-type impurities (or dopant) are denoted by adding the sign + or the sign − to the letters N and P to indicate a high or low concentration of impurities, respectively, or the sign ++ or the sign −− to indicate a very high or a very low concentration of impurities, respectively; the letters N and P without the addition of any sign + or − denote concentrations of intermediate value.

In detail, the power MOS 100 is integrated in a chip of semiconductor material, which is formed by an N++ type support substrate 105 (much more thick in reality), on which an N− type epitaxial layer (110) is arranged. The chip 105,110 has a back (lower) surface 115d—defined by an exposed surface of the substrate 105—and a front (upper) surface 115u—defined by an exposed surface of the epitaxial layer 110.

A plurality of P-type body regions 120 extend from the front surface 115u within the epitaxial layer 110. A P-type drain column 125 extends from the bottom of each body region 120 towards the back surface 115d. The drain column 125 stops at a pre-defined distance from the substrate 105 (for example, 10-150 µm); this distance is chosen (according to the desired breakdown voltage of the power MOS 100), so as to ensure that the electric field is substantially zero at an interface between the substrate 105 and the epitaxial layer 110 in a normal operating condition of the power MOS 100.

In this way, a drain channel 130 is defined between each pair of adjacent drain columns 125 (formed by the corresponding portion of the epitaxial layer 110). An N-type source region 135 extends from the front surface 115u within each body region 120; in this way, a channel area 140 (wherein a channel of the power MOS 100 forms during its operation) is defined in each body region 120 between the corresponding source region 135 and each adjacent drain channel 130.

A thin oxide layer 145 and a polysilicon layer 150 are stacked to each other on top of each channel area 140 (with the thin oxide layer 145 that insulates the polysilicon layer 150 from the front surface 115u). All the polysilicon layers 145 are connected to each other (as schematically shown in the figure) so as to define a gate terminal G of the power MOS 100. Each polysilicon layer 150 is insulated (above and laterally) by a further oxide layer 155. The chip 105,100 is completely covered above by a metal layer 160, which reaches the portion left exposed of the front surface 115u so as to contact all the body regions 120 and the corresponding source regions 135; this metal layer 160 defines a source terminal S of the power MOS 100 (short-circuited to its body regions 120). A further metal layer 165 is arranged on the whole back surface 115d (in contact with the substrate 105), so as to define a drain terminal D of the power MOS 100.

The drain columns 125 are obtained by making the epitaxial layer 110 through multiple growth operations. During each one of these operations, a basic epitaxial layer is grown (initially on the substrate 105 and then on a previous basic epitaxial layer); P-type impurities are implanted in each basic epitaxial layer through windows being all equal (defined through a common photo-lithographic mask). At the end, the P-type impurities are diffused so as to join to each other (and to the body region 120) for obtaining the drain columns 125.

As a consequence, each drain column 125 will be made up of a series of basic drain regions being equal to each other (4 in the example in the figure), each one of them crossing a corresponding basic epitaxial layer; in particular, the basic drain regions have a curved profile (with convex side borders), and all have the same maximum width, depending on the extension of the corresponding (equal) windows of the common mask. In this way, each drain channel 130 has a width L (defined by the distance between the envelopes of the basic drain regions of the corresponding pair of adjacent drain columns 125), which remains constant along all its length (in vertical).

Turning now to FIG. 2A, there is instead shown a partial view in cross-section of a power MOS 200 according to an embodiment of the invention. In this case, the epitaxial layer (denoted with the reference 210) has a composite structure; in particular, a lower epitaxial layer 210d—this time of N-type—is arranged on the substrate 105; an upper epitaxial layer 210u as above of N-type is arranged on the epitaxial layer 210d—with the front surface 115u that is now defined by an exposed surface of the epitaxial layer 210u.

Each drain column (indicated with the reference 225) includes a prevalent upper portion 225u formed in the epitaxial layer 210u (extending from a proximal longitudinal end thereof to the front surface 115u). The upper portion 225u is again formed by a series of basic drain regions being equal to each other (3 in the example in the figure); as above, the basic drain regions of the upper portion 225u have a curved profile (with convex side borders), and all have the same maximum width. In this way, each drain channel (indicated with the reference 230) will include a corresponding prevalent upper portion 230u formed in the epitaxial layer 210u with a width Lu (defined by the distance between the envelops of the basic drain regions in the upper portions 225u of the corresponding pair of adjacent drain columns 225), which remains constant along all its length. Each drain channel 225 instead includes a lower residual portion 225d formed in the epitaxial layer 210d (extending from a proximal longitudinal end to the back surface 115d). The lower portion 225d turns out to be made up of a different basic drain region; the basic drain region of the lower portion 225d has again a curved profile (with convex side borders), but has a higher maximum width. In this way, each drain channel 230 will include a corresponding lower residual portion 230d being formed in the epitaxial layer 210d, having a width Ld (defined by the minimum distance between the basic drain regions in the lower portions 225d of the corresponding pair of adjacent drain columns 225), which is smaller than the width Lu.

In other terms, each drain channel 230 has no uniform pattern any longer, but it has, in the lower portion 230d, a bottleneck that is less doped (with respect to the upper portion 230u). For example, the length of the lower portion 230d is equal to 0.5-0.35, preferably equal to 0.1-0.3, and still more preferably equal to 0.15-0.25 (for example, equal to 0.2) times the length of the upper portion 230u; typically, the length of the lower portion 230d is 3-10 μm, and the length of the upper portion 230u is 15-50 μm. Besides, for example, the width Ld of the lower portion 230d is equal to 0.65-0.95, preferably equal to 0.7-0.9, and more preferably equal to 0.75-0.85 (for example, equal to 0.8) times the width Lu of the upper portion 230u; typically, the width Ld is 0.8-4 μm and the width Lu is 1-5 μm. At the end, for example, the epitaxial layer 210d (and hence the lower portion 230d) have a resistivity equal to 5-20, preferably equal to 7-15, and more preferably equal to 8-12 (for example, equal to 10) times the resistivity of the epitaxial layer 210u (and hence of the upper portion 230u); typically, the resistivity of the epitaxial layer 210d is 20-600 Ω/cm and the resistivity of the epitaxial layer 230u is 2-60 Ω/cm.

The above-described structure can be made with different layouts of the power MOS 200.

An example of such a layout is shown in the plan view with removed parts of FIG. 2B, at the level of the front surface of the power MOS 200 (along whose A-A directrix the section of FIG. 2A is taken). The body regions 120 include strips extending along the whole length of the power MOS 200; each source region 135 includes two strips extending along the whole length of the power MOS 200 at the side of the corresponding body region 120. In this case, also each drain column includes a strip, extending along the whole length of the power MOS 200 under the corresponding body region 120, with its upper portion 225u (narrower) and its lower portion 225d (larger). Therefore, the width Lu of the upper portion of each drain channel will be equal to the distance between the two strips of the upper portions 225u of the corresponding drain columns, while the width Ld of the lower portion of each drain channel will be equal to the distance between the two strips of the lower portions 225d of the corresponding drain columns.

Another example of layout of the same power MOS 200 is shown in FIG. 2C (along whose A-A directrix the section of FIG. 2A is taken). As above, the body regions 120 and the source regions includes strips extending along the whole length of the power MOS 200. Each drain column instead includes a pillar having a circular section, with its upper portion 225u (narrower) and its lower portion 225d (larger). Each body region 120 now contains a plurality of drain columns 225u,225d being uniformly distributed along its length; the drain columns 225u,225d of each body region 120 are staggered with respect to the drain columns 225u,225d of each adjacent body region 120. Therefore, the width Lu of the upper portion of each drain channel will be equal to the distance between the two pillars of the upper portions 225u of the corresponding drain columns, while the width Ld of the lower portion of each drain channel will be equal to the distance between the two pillars of the lower portions 225d of the corresponding drain columns.

With reference now to FIG. 4A, the power MOS 200 is switched on by applying a positive voltage Vgs between the gate terminal and the source terminal; when the voltage Vgs exceeds a threshold value of the power MOS 200, an N-type channel 440 is created for charge inversion of the corresponding area of the body region under the polysilicon layer 150 (wider in proximity of the source region 135); the channel 440 completely crosses a depletion region of a (reverse biased) PN junction, which is formed between the P-type body region 120 (short-circuited to the source terminal S) and the N-type drain channel 230, when a positive voltage Vds is applied between the drain terminal and the source terminal. Hence a current Ids flows from the source terminal to the drain terminal of the power MOS 200 thanks to the electrons that are provided by the source terminal S to each source region 135, pass through the corresponding channel 440, pass through the corresponding drain channel 230, and hence are collected by the drain terminal D. In this condition, the power MOS 200 is in a linear operation region with the current Ids that grows substantially in proportion with the growing of the voltage Vds.

At the same time, also a PN junction formed between each P-type drain column 225 (short-circuited to the source terminal S) and the N-type drain channel 230 is reverse biased. Therefore, when the current Ids grows thereby causing a corresponding growth of the voltage Vds, the depletion regions of such a PN junction 225-230 widen, thereby narrowing the drain channel 230; this increases the resistance of the drain channel 230, so that the current Ids accordingly reduces.

When the voltage Vds reaches a saturation value Vsat so that the depletion regions of the two PN junctions 225-230 reach each other, as shown in FIG. 4B, the drain channel 230 can be considered substantially closed. In this condition (called pinch-off), the power MOS 200 is in a saturation operating region, in which the current Ids remains constant at a saturation value Isat regardless of further increases of the voltage Vds. In reality, the depletion regions of the two PN junctions 225-230 do not come really in contact, but they remain anyway separated by a narrow neutral region with width Ld(m)—because of the electrons being supplied by the corresponding channel 440 that balance the depletion caused by the reverse biasing of the PN junctions 225-230. Therefore, even beyond the saturation voltage Vsat, the current Ids does not remain exactly constant, but slightly grows again beyond the saturation current Ids (thanks to the minimal electrons flux that is withstood by such a neutral region).

Normally, the widening of the depletion regions of the PN junctions 225-230 is slightly higher in proximity of the back surface 115*d*—because in this position it is higher the reverse voltage between the drain columns 225 (farther from the source terminal S) and the drain channel 230 (closer to the drain terminal D).

In the solution according to an embodiment of the invention, this phenomenon is expressly improved by the particular structure of each drain channel 230. In fact, the smaller width Ld of the lower portion 230*d* (with respect to the width Lu of the upper portion 230*u*) nears the depletion regions of the PN junctions 225-230 to an higher extent; similarly, the higher resistivity of the lower portion 230*d* (with respect to the resistivity of the upper portion 230*u*) extends the depletion regions of the PN junctions 225-230 in the drain channel 230 to a higher extent. Therefore, the drain channel 230 is closed at smaller voltages Vds (and hence at smaller saturation currents Isat).

This structure obviously leads to an increase of the output resistance (Ron) of the power MOS 200, because of the smaller width Ld and of the higher resistivity of the lower portion 230*d* of each drain channel 230. Nevertheless, this does not impact the performance of the power MOS 200 substantially. In fact, the lower portion 230*d* (at lower width Ld and higher resistivity) is only a minimal part of each drain column 230; on the contrary, the prevalent part of the drain channel 230 defined by the upper portion 230*u* maintains the desired width Lu and resistivity. Therefore, the output resistance of the power MOS 200 is only slightly increased, because the impact of the lower portion 230*d* is limited in normal operating conditions.

The above-described solution allows substantially reducing the saturation current Isat of the power MOS 200 (with anyway acceptable output resistance); for example, experimental results have shown that this power MOS 200 has saturation currents Isat up to 10 times smaller than the known multi-drain power MOSs have (up to 1-10 A). As a consequence, the power that needs to be dissipated by the power MOS 200 in limit operating conditions—for example, in case of short-circuit of a load driven by the power MOS 200, in which the voltage at its terminals reaches a supply voltage (such as 100-200V)—is accordingly reduced (i.e., down to 0.1-2 kW). This condition can be withstood by the power MOS 200 (without causing its breakdown) even for relatively long times (of the order of 0.1-10 μs).

In particular, the saturation current Isat of the power MOS 200 can be defined at will in the design phase of the power MOS 200. This allows obtaining a self-limited power MOS 200 (with respect to its saturation current Isat). In this way, it is possible to avoid the connection of any passive current limiter in series to the power MOS; this reduces the area and the complexity of a system wherein the power MOS is used. Besides, a possible protection device of the power MOS (used to activate an active current limiter) can have a relatively high intervention time; this reduces the cost of the protection device and hence the cost of the whole system.

In the above described specific embodiment, the arrangement of the bottleneck of each drain channel 230 in proximity of the back surface 115*d* is particularly advantageous, since it exploits the natural higher shrinkage of the drain channel 230 that already occurs in this position. Besides, the combination of the smaller width Ld and of the higher resistivity of the lower portion 230*d* of each drain channel 230 obtains a synergic effect, which provides the best performance of the proposed solution (in terms of reduction of the saturation current Isat).

Moving now to FIG. 5, there is shown a comparative graph of an output characteristic of different power MOSs. Each output characteristic is defined by representing the current Ids (in A) as a function of the voltage Vds (in V). An initial portion of the output characteristic relates to the linear operating region, with a substantially constant slope (represented in the figure by a corresponding broken line), which defines the output resistance Ron of the power MOS; a remaining portion of the output characteristic instead refers to the saturation operating region, wherein the current Ids substantially remains constant at the saturation current Isat.

In particular, a curve 505.1 represents the output characteristic of a standard power MOS known in the art (with an output resistance Ron.1 and a saturation current Isat.1), a curve 505.2 represents the output characteristic of a multi-drain power MOS known in the art (with an output resistance Ron.2 and a saturation current Isat.2), while a curve 505.3 represents the output characteristic of a multi-drain power MOS according to an embodiment of the invention (with an output resistance Ron.3 and a saturation current Isat.3).

As it can be noticed, the output resistance Ron.2 of the known multi-drain power MOS is advantageously smaller than the output resistance Ron.1 of the known standard power MOS; however, this causes the drawback of significantly increasing the saturation current Isat.2 of the known multi-drain power MOS with respect to the saturation current Isat.1 of the known standard power MOS. In the multi-drain power MOS according to an embodiment of the invention, instead, the saturation current Isat.3 is significantly reduced (close to the saturation current Isat.1 of the known standard power MOS); at the same time, however, the output resistance Ron.3 is only slightly increased (remaining near to the output resistance Ron.2 of the known multi-drain power MOS, and however always much smaller than the output resistance Ron.1 of the known standard power MOS).

With reference now to FIG. 6, there is shown a partial view in cross-section of a power MOS 600 according to another embodiment of the invention.

In this case, the lower epitaxial layer (denoted with the reference 610*d*) has a composite structure; in particular, an auxiliary N-type epitaxial layer 610*d*1 (i.e., with the same resistivity of the epitaxial layer 210*u*) is arranged on the substrate 105, and another epitaxial layer 610*d*2 as above of N−− type is arranged on the epitaxial layer 601*d*1 (with the epitaxial layer 210*u* that is now arranged on the epitaxial layer 610*d*2); the lower portion 225*d* of each drain column 225 is completely made in the epitaxial layer 610*d*2 (with a depth substantially equal to its thickness), so that the lower portion 230*d* of each drain channel 230 as well will be completely defined in the epitaxial layer 610*d*2.

This solution allows reducing the saturation current Isat of the power MOS 600 as above (thanks to the smaller width Ld and to the higher resistivity of the lower portion 230*d*). However, the power MOS 600 now has a smaller output resistance.

In fact, the higher resistivity is limited only to the epitaxial layer 610d2, where required so as to define each lower portion 230d; on the contrary, the epitaxial layer 610d1 has the same desired resistance of the epitaxial layer 210u.

The main phases of a production process of the power MOS according to an embodiment of the invention are shown in FIGS. 7A,7A'-7E.

The process starts in FIG. 7A, wherein the epitaxial layer 210d is grown on the substrate 105. A photo-resist material 705 is then deposited on the epitaxial layer 210d; the photo-resist layer 705 is shaped through a photo-lithographic mask (not shown in the figure) having windows with a width Wd (corresponding to the width of the lower portions of the drain columns); in this way, in the photo-resist layer 705 there are opened corresponding windows, which leave exposed the desired portions of the epitaxial layer 210d. At this point, P-type impurities 710 (for the corresponding lower portions of the drain columns) are implanted into the epitaxial layer 210d through the photo-resist layer 705. The photo-resist layer 705 is then stripped.

Analogous considerations apply to FIG. 7A', wherein the epitaxial layer 210d is obtained by growing the epitaxial layer 610d1 on the substrate 105 and then the epitaxial layer 610d2 on the epitaxial layer 610d1. As above, the P-type impurities 710 are implanted in the epitaxial layer through the windows of the same photo-resist layer 705, which is then stripped.

Figure 7B:
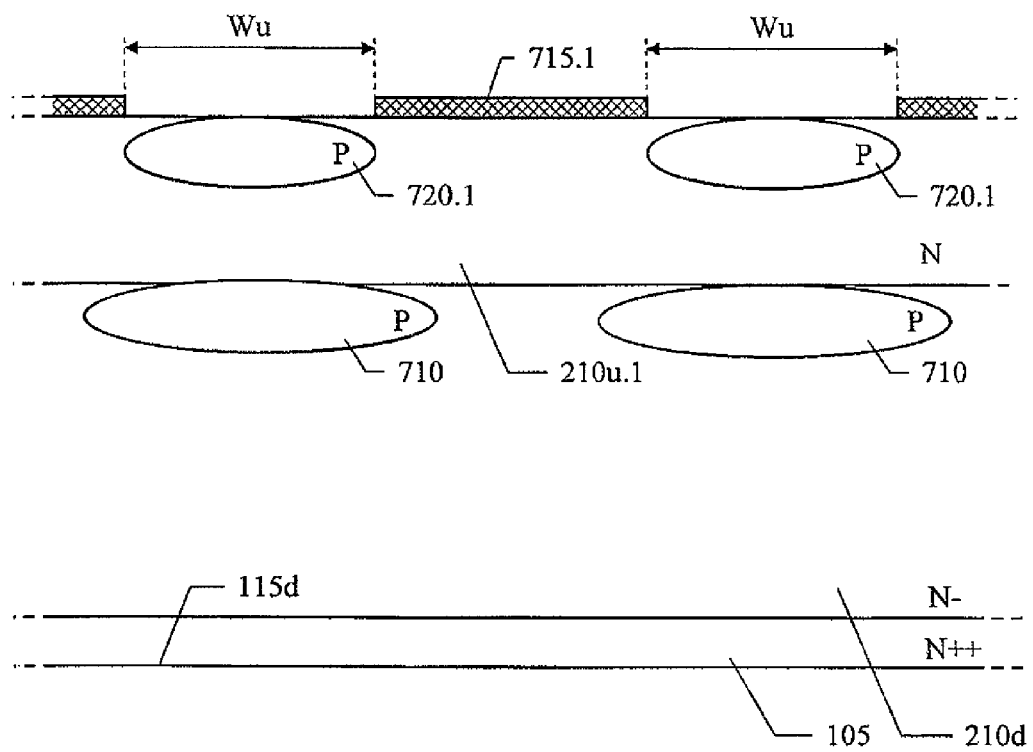

In both cases, the process continues at FIG. 7B (from FIG. 7A or from FIG. 7A'), where an N-type basic epitaxial layer 210u.1 (for the upper epitaxial layer) is grown on the epitaxial layer 210d of FIG. 7A—or similarly on the epitaxial layer 610d2 of FIG. 7A' (not shown in the figure). A photo-resist layer 715.1 is deposited on the epitaxial layer 210u.1; the photo-resist layer 715.1 is then shaped through a photo-lithographic mask (not shown in the figure) having windows with a width Wu, smaller than the width Wd (corresponding to the width of the upper portions of drain columns); in this way, in the photo-resist layer 715.1 there are opened corresponding windows, which leave exposed the desired portions of the epitaxial layer 210u.1. At this point, P-type impurities 720.1 (for the corresponding basic drain regions of the upper portions of the drain columns) are implanted into the epitaxial layer 210u.1 through the windows of the photo-resist layer 715.1. The photo-resist layer 715.1 is then stripped.

Figure 7C:
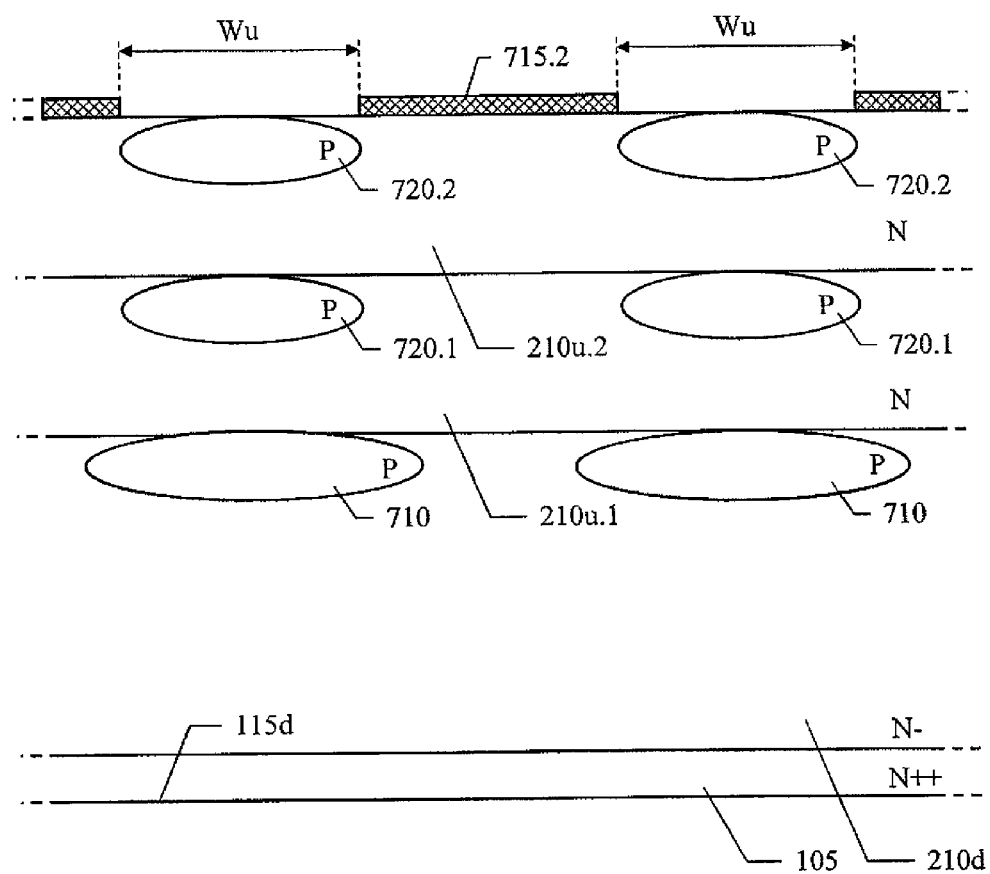

With reference now to FIG. 7C, a further basic epitaxial layer 210u.2 of the same type is grown on the epitaxial layer 210u.1. A photo-resist layer 715.2 is then deposited on the epitaxial layer 210u.2, and it is shaped through the same mask (having windows with width Wu) so as to open corresponding windows in the photo-resist layer 715.2, which leave exposed the desired portions of the epitaxial layer 210u.2. As above, P-type impurities 720.2 (for the corresponding basic drain regions of the upper portions of the drain columns) are implanted into the epitaxial layer 210u.2 through the windows of the photo-resist layer 715.2, which is then stripped.

Figure 7D:
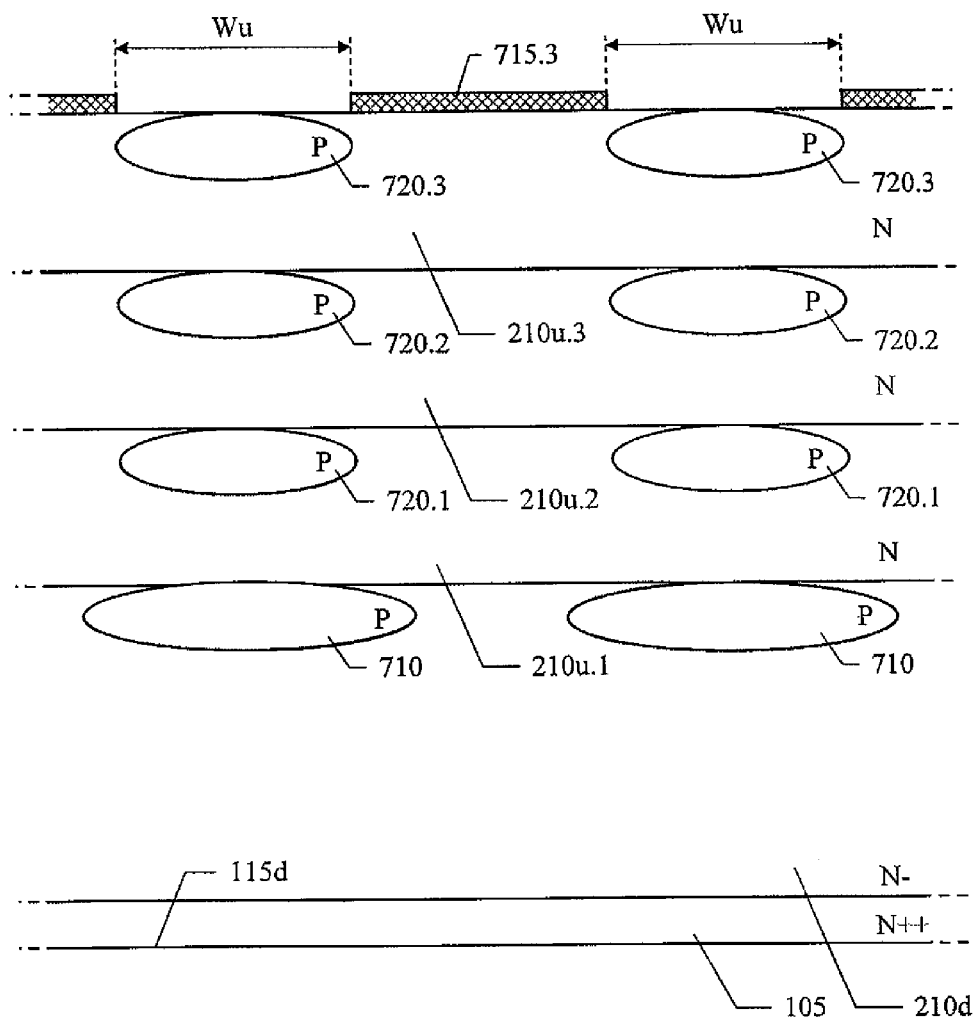

Likewise, as shown in FIG. 7D, a further basic epitaxial layer 210u.3 of the same type is grown on the epitaxial layer 210u.2. A photo-resist layer 715.3 is then deposited on the epitaxial layer 210u.3, and it is shaped through the same mask (having windows with Wu) so as to open corresponding windows in the photo-resist layer 715.3 that leave exposed the desired portions of the epitaxial layer 210u.3. As above, P-type impurities 720.3 (for the corresponding basic drain regions of the upper portions of the drain columns) are implanted into the epitaxial layer 210u.3 through the windows of the photo-resist layer 715.3, which is then stripped.

Figure 7E:
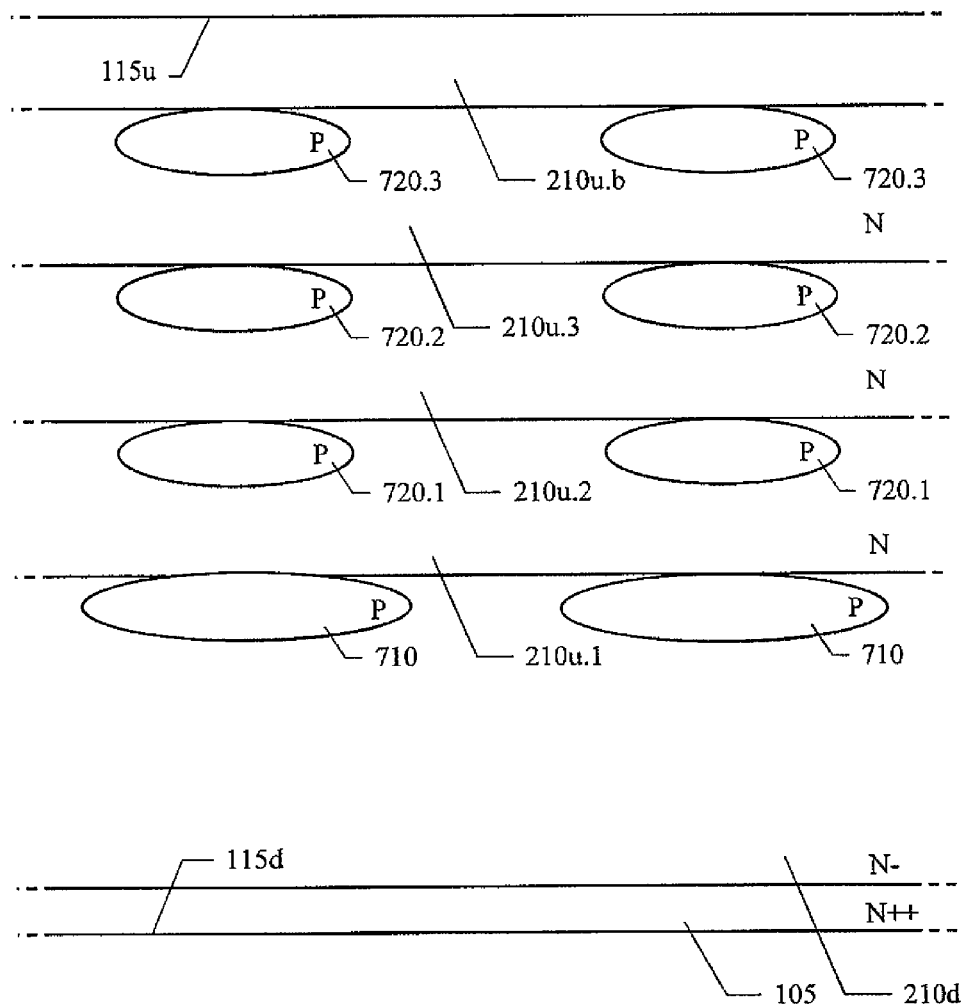

Then the process continues at FIG. 7E, where another basic epitaxial layer 210u.b of the same type (for the body regions) is grown on the epitaxial layer 210u.3.

Figure 7F:
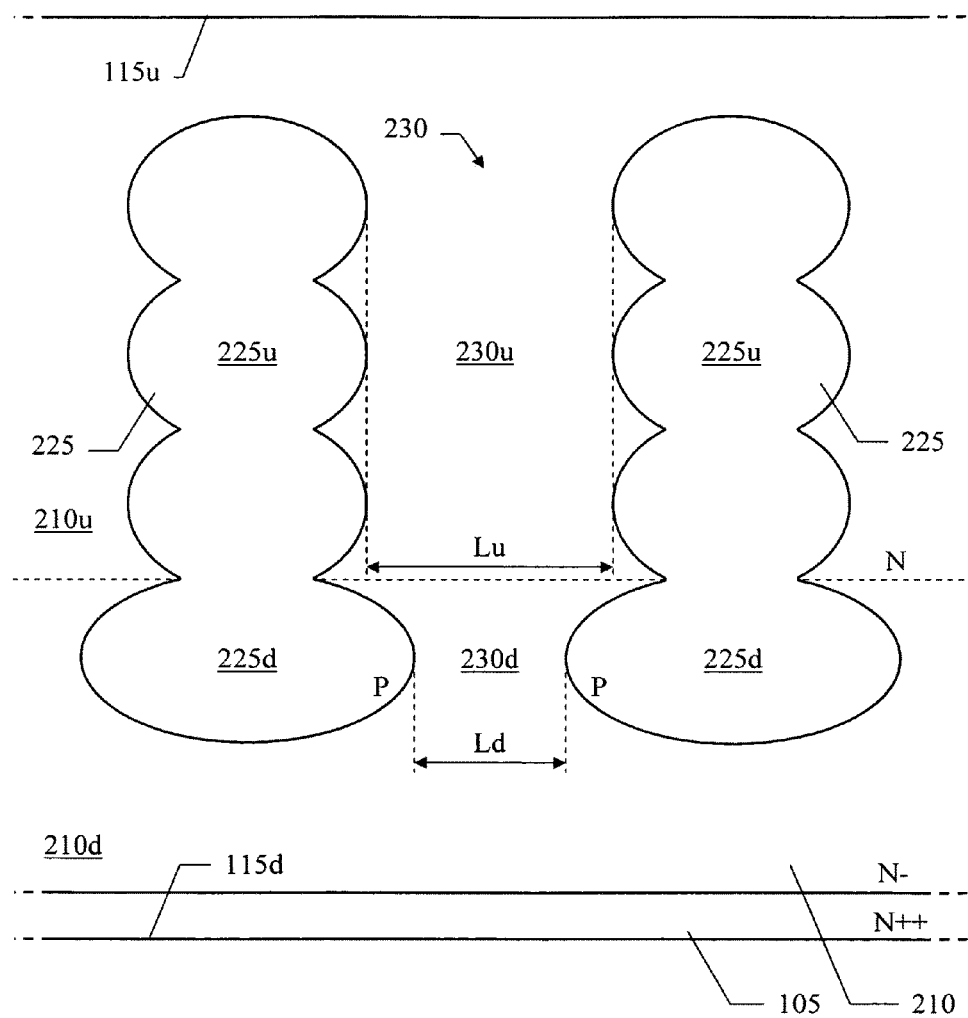

At this point, a thermal diffusion process is performed; in this way, as shown in FIG. 7F, the impurities previously implanted in the epitaxial layer 210d and in the various basic epitaxial layers (which on the whole define the epitaxial layer 210u) diffuse, both vertically and horizontally, so as to join to each other for defining the drain columns 225. In this way, in each drain column 225 there is obtained its upper portion 225u (narrower) and its lower portion 225d (wider); this is due both to the different width of the windows of the masks used to implant the corresponding impurities (Wu for the upper portion 225u and Wd for the lower portion 225d, with Wu<Wd) and to the different resistivity of the corresponding epitaxial layers (N for the upper portion 225u and N− for the lower portion 225d, with the higher resistivity that makes it easier the diffusion of the impurities).

Then the process continues as usual to complete the structure of the power MOS 200 shown in FIG. 2 (or similarly the power MOS 600 shown in FIG. 6). In particular, a thin oxide layer is grown with a thermal process on the front surface 115u; a polysilicon layer is then deposited on the thin oxide layer. The thin oxide and polysilicon layers are selectively etched through a photo-lithographic process, so as to obtain the thin oxide layer 145 and the polysilicon layer 150 stacked to each other on top of each channel region 140 (with the polysilicon layer 150 that forms the gate terminal G). P-type impurities are implanted into the epitaxial layer 210u (through the portion of the front surface 115u left exposed of the layers 145,150), so as to obtain the body regions 120. N-type impurities are then implanted into each body region 120 (through a corresponding mask of photo-resist material, not shown in figure), so as to obtain the corresponding source region 135. At this point, a further oxide layer is deposited on the obtained structure, and it is selectively etched (through a photo-lithographic process) so as to obtain the oxide layer 155 that insulates each polysilicon layer 145. The metal layer 160 is hence deposited, so as to reach the exposed portion of the front surface 115u (thereby contacting all the body regions and the corresponding source regions 135)—so as to form the source terminal S. At the end, the metal layer 165 is deposited on the whole rear surface 115d (so as to form the drain terminal D).

Naturally, in order to satisfy local and specific requirements, a person skilled in the art may apply to the solution described above many logical and/or physical modifications and alterations. More specifically, although this solution has been described with a certain degree of particularity with reference to preferred embodiment(s) thereof, it should be understood that various omissions, substitutions and changes in the form and details as well as other embodiments are possible. Particularly, the same solution may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice.

For example, similar considerations apply if the power MOS (or any other equivalent field-effect transistor) has a different structure or includes other components. Besides, the power MOS can have different operating characteristics; in particular, the above reported values of breakdown voltage, output resistance and saturation current are merely indicative, and should not be interpreted in a limitative way. Moreover, the N-type regions can be replaced with P-type regions, and vice versa, and the various regions can have different concentrations of impurities. Besides, the power MOS can be manufactured with a different technology, with another layout, and the like. For example, the body regions (and the corresponding drain columns) can be interdigitated, the source regions can include a single basic region in each body region (for example, frame shaped), the gate terminal, the source terminal and/or the drain terminal can be made with other material (for example, metal alloys), and so on. Besides, even though in the preceding description explicit reference has been made to specific values of the length and the width of the upper portion and the lower portion of each drain channel, this should not be interpreted anyway in a limitative way.

Although the proposed solution provides better performance when the bottleneck of each drain channel is formed in its lower portion, implementation variations wherein this bottleneck is formed in any other position (for example, in one or more intermediate regions) are not excluded.

Similar considerations apply if the epitaxial layers in which the basic drain regions are formed have resistivity of different values. At the limit, in a basic embodiment of the invention, it is even possible to have all the epitaxial layers with the same resistivity (by exploiting only the different width of the upper portion and of the lower portion of each drain channel); on the contrary, it is possible to have the drain columns and hence the drain channels with uniform width (by exploiting only the different resistivity of the upper portion and of the lower portion of each drain channel).

Anyhow, the drain channels can be made in other way (for example, through additional dedicated regions).

Obviously, the above described number of basic epitaxial layers (and of corresponding basic drain elementary regions), is merely exemplificative. In fact, both the lower portion and the upper portion of each drain column can consist of any number (i.e., one or more) of basic drain regions, each one of them being made in a corresponding basic epitaxial layer.

The additional epitaxial layer (between the substrate and the lower epitaxial layer) may have any other resistivity lower than the resistivity of the lower epitaxial layer, possibly different from the resistivity of the upper epitaxial layer. Even in this case, it is possible to provide any number (i.e., one or more) of such additional epitaxial layers; alternately, nothing prevents obtaining the same result by adding dedicated regions at high concentration of impurities in the unique epitaxial layer wherein the lower portion of each drain column is made.

The proposed solution can be implemented with an equivalent manufacturing process (by using similar steps, by removing certain steps being not essential, or by adding further optional steps); besides, the steps can be executed in a different order, in parallel or concurrently (at least partially). In particular, it is possible to use masks being different in number and type, different process parameters, equivalent operations, and the like.

It should be readily apparent that the proposed structure might be part of the design of an integrated circuit. The design may also be created in a programming language; moreover, if the designer does not fabricate chips or masks, the design may be transmitted by physical means to others. In any case, the resulting integrated circuit may be distributed by its manufacturer in raw wafer form, as a bare die, or in packages. Moreover, the proposed solution may be integrated with other circuits in the same chip, or it may be mounted in intermediate products (such as mother boards) and coupled with one or more other chips (such as a processor or a memory). In any case, the integrated circuit is suitable to be used in complex systems (such as computers).

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A field-effect transistor integrated in a chip of semiconductor material of a first type of conductivity having a first main surface and a second main surface opposed to each other, wherein the transistor includes:
   a plurality of body regions of a second type of conductivity each one extending from the second main surface in the chip,
   a plurality of drain columns of the second type of conductivity each one extending from a body region towards the first main surface at a predefined distance therefrom, a plurality of drain channels being defined in the chip each one extending longitudinally between a pair of adjacent drain columns,
   a plurality of source regions of the first type of conductivity each one extending from the second main surface in a body region, a plurality of channel areas being defined each one in a body region between a source region of the body region and each drain channel being adjacent to the body region,
   a gate terminal contacting gates extending over the channel areas, the gates being insulated from the second main surface,
   a source terminal contacting the source regions on the second main surface, and
   a drain terminal contacting the chip on the first main surface,
   wherein each drain channel includes a residual first portion having a first transversal width that is configured to limit an amount of current flowing through the drain channel and a prevalent second portion having a second transversal width higher than the first transversal width, and
   wherein the first portion of each drain channel has a first resistivity and the second portion of each drain channel has a second resistivity lower than the first resistivity and wherein the chip includes a substrate with a resistivity lower than the first resistivity and the second resistivity having an exposed surface defining the first main surface, at least one first epitaxial layer with the first resistivity being grown on a further surface of the substrate opposite the first main surface, and at least one second epitaxial layer with the second resistivity being grown on the at least one first epitaxial layer, wherein each drain column includes a first basic drain region of the second type of conductivity crossing each at least one first epitaxial layer, the first portion of each drain channel including a portion of each at least one first epitaxial layer between the first basic drain regions of a corresponding pair of adjacent drain columns, and wherein each drain column includes a second basic drain region of the second type of conductivity crossing each at least one second epitaxial layer, the second portion of each drain channel including a portion of each at least one second epitaxial layer between the second basic drain regions of the corresponding pair of adjacent drain columns.

2. The transistor according to claim 1, wherein in each drain channel the first portion extends from a first longitudinal end of the drain channel proximate to the first main surface and the second portion extends from a second longitudinal end of the drain channel proximate to the second main surface.

3. The transistor according to claim 1, wherein the at least one first epitaxial layer comprises a single first epitaxial layer and the at least one second epitaxial layer consists of a sequence of second epitaxial layers, an initial second epitaxial layer being grown on the first epitaxial layer and each next second epitaxial layer being grown on a preceding second epitaxial layer, and wherein each drain column includes a single first basic drain region having a further first transversal width and a plurality of second basic drain regions having a common further second transversal width lower than the further first transversal width.

4. The transistor according to claim 1, wherein the chip further includes at least one auxiliary epitaxial layer between the substrate and the at least one first epitaxial layer, the at least one auxiliary epitaxial layer having a resistivity lower than the first resistivity.

5. A method for integrating a field-effect transistor in a chip of semiconductor material of a first type of conductivity having a first main surface and a second main surface opposed to each other, wherein the method includes the steps of:
forming a plurality of body regions of a second type of conductivity each one extending from the second main surface in the chip,
forming a plurality of drain columns of the second type of conductivity each one extending from a body region towards the first main surface at a predefined distance therefrom, a plurality of drain channels being defined in the chip each one extending longitudinally between a pair of adjacent drain columns,
forming a plurality of source regions of the first type of conductivity each one extending from the second main surface in a body region, a plurality of channel areas being defined each one in a body region between a source region of the body region and each drain channel being adjacent to the body region,
forming a gate terminal contacting gates extending over the channel areas, the gates being insulated from the second main surface,
forming a source terminal contacting the source regions on the second main surface, and
forming a drain terminal contacting the chip on the first main surface,
wherein the step of forming a plurality of drain columns defines each drain channel to include a residual first portion having a first transversal width that is configured to limit an amount of current flowing through the drain channel and a prevalent second portion having a second transversal width higher than the first transversal width, and
wherein in each drain channel the first portion extends from a first longitudinal end of the drain channel proximate to the first main surface and the second portion extends from a second longitudinal end of the drain channel proximate to the second main surface, and wherein the first portion has a first resistivity and the second portion has a second resistivity lower than the first resistivity and wherein the step of forming a plurality of drain columns includes:
providing a substrate with a resistivity lower than the first resistivity and the second resistivity having an exposed surface defining the first main surface,
growing at least one first epitaxial layer with the first resistivity on a further surface of the substrate opposite the first main surface,
implanting first impurities of the second type of conductivity into each first epitaxial layer through a first mask having a first window for each drain column with a further first transversal width,
growing at least one second epitaxial layer with the second resistivity on the at least one first epitaxial layer,
implanting second impurities of the second type of conductivity into each second epitaxial layer through a second mask having a second window for each drain column with a further second transversal width lower than the first transversal width, and
diffusing the first impurities and the second impurities to obtain the drain columns.

6. The method according to claim 5, further including the step of:
growing at least one auxiliary epitaxial layer having a resistivity lower than the first resistivity on the further surface of the substrate before the step growing the at least one first epitaxial layer, the at least one first epitaxial layer being grown on the at least one auxiliary epitaxial layer.

7. The method according to claim 5, wherein the residual first portion has a minimum first transversal width and the prevalent second portion has a minimum second transversal width greater than the minimum first transversal width.

8. The transistor according to claim 1, wherein the residual first portion has a minimum first transversal width and the prevalent second portion has a minimum second transversal width greater than the minimum first transversal width.

9. A field-effect transistor comprising:
a plurality of drain columns of a first conductivity type extending from a first surface of a substrate into the substrate;
at least one drain channel of a second conductivity type located between at least two of the drain columns; and
self-limiting means within the at least one drain channel for limiting current flow within the transistor to a saturation current under short circuit conditions that can be withstood by the transistor, wherein the self-limiting means is defined within a first epitaxial layer that is different than a second epitaxial layer adjacent to the self-limiting means and wherein the self-limiting means is configured to produce depletion regions under source-to-drain bias that extend from the at least two drain columns toward a center of the at least one drain channel to an extent to limit saturation current flow through the at least one drain channel to a selected value.

10. The field-effect transistor of claim 9, wherein the self-limiting means comprises a region of the at least one drain channel in the first epitaxial layer having a lower dopant concentration than an adjacent region of the at least one drain channel in the adjacent second epitaxial layer.

11. The field-effect transistor of claim 10, wherein a resistivity of the region of the at least one drain channel having lower dopant concentration is between about 5 to about 20 times higher than a resistivity of the adjacent region.

12. The field-effect transistor of claim 10, wherein a resistivity of the region of the at least one drain channel having lower dopant concentration is between about 8 to about 12 times higher than a resistivity of the adjacent region.

13. The field-effect transistor of claim 12, wherein the self-limiting means further comprises a region of restrictive width of the at least one drain channel being less than a width of an adjacent portion of the at least one drain channel.

14. The field-effect transistor of claim 13, wherein the restrictive width is between about 0.65 to about 0.95 times the width of the adjacent portion of the at least one drain channel.

15. The field-effect transistor of claim 13, wherein the restrictive width is between about 0.75 to about 0.85 times the width of the adjacent portion of the at least one drain channel.

16. The field-effect transistor of claim 13, wherein a length of the at least one drain channel having the restrictive width is between about 0.05 to about 0.35 times a length of the adjacent portion of the at least one drain channel.

17. The field-effect transistor of claim 13, wherein the region of restrictive width is within the region of the at least one drain channel having a lower dopant concentration.

18. The field-effect transistor of claim 9, wherein the self-limiting means comprises a region of restrictive width of the at least one drain channel being less than a width of an adjacent portion of the at least one drain channel.

19. The field-effect transistor of claim 18, wherein the adjacent portion of the at least one drain channel has a first length along the at least one drain channel greater than a second length along the at least one drain channel of the region of restrictive width.

20. The field-effect transistor of claim 9, wherein a channel area below a gate of the field-effect transistor and the at least one drain channel are formed of a same type of semiconductor material.

21. A field-effect transistor comprising:
a plurality of drain columns of a first conductivity type extending from a first surface of a substrate into the substrate;
at least one drain channel of a second conductivity type located between at least two of the drain columns; and
a current-limiting portion of the at least one drain channel configured to limit current flow within the transistor to a saturation current under short circuit conditions that can be withstood by the transistor for at least 0.1 microsecond, wherein the current-limiting portion has a first resistivity that is higher than a region of the drain channel adjacent to the current-limiting portion and wherein the current-limiting portion is configured to produce depletion regions under source-to-drain bias that extend from the at least two drain columns toward a center of the at least one drain channel to an extent to limit saturation current flow through the at least one drain channel to a selected value.

22. The field-effect transistor of claim 21, wherein the current-limiting portion comprises a region of the at least one drain channel having a lower dopant concentration than the adjacent region of the at least one drain channel.

23. The field-effect transistor of claim 22, wherein a resistivity of the region of the at least one drain channel having lower dopant concentration is between about 5 to about 20 times higher than a resistivity of the adjacent region.

24. The field-effect transistor of claim 22, wherein a resistivity of the region of the at least one drain channel having lower dopant concentration is between about 8 to about 12 times higher than a resistivity of the adjacent region.

25. The field-effect transistor of claim 24, wherein the current-limiting portion further comprises a region of restrictive width of the at least one drain channel being less than a width of the adjacent portion of the at least one drain channel.

26. The field-effect transistor of claim 25, wherein the restrictive width is between about 0.65 to about 0.95 times the width of the adjacent portion of the at least one drain channel.

27. The field-effect transistor of claim 25, wherein the restrictive width is between about 0.75 to about 0.85 times the width of the adjacent portion of the at least one drain channel.

28. The field-effect transistor of claim 25, wherein a length of the at least one drain channel having the restrictive width is between about 0.05 to about 0.35 times a length of the adjacent portion of the at least one drain channel.

29. The field-effect transistor of claim 25, wherein the region of restrictive width and the region of the at least one drain channel having a lower dopant concentration are defined within a first epitaxial layer and the adjacent portion of the at least one drain channel comprises at least one second epitaxial layer.

30. The field-effect transistor of claim 21, wherein the current-limiting portion comprises a region of restrictive width of the at least one drain channel being less than a width of the adjacent portion of the at least one drain channel.

31. The field-effect transistor of claim 30, wherein the adjacent portion of the at least one drain channel has a first length along the drain channel greater than a second length along the at least one drain channel of the region of restrictive width.

32. The field-effect transistor of claim 21, wherein a channel area below a gate of the field-effect transistor and the at least one drain channel are formed of a same type of semiconductor material.

33. A method for making a field effect transistor, the method comprising:
forming at least two drain columns of a first conductivity type extending from a first surface of a semiconductor structure into the semiconductor structure;
forming a drain channel of a second conductivity type located between at least two of the drain columns, wherein the drain channel includes a varied semiconductor structure configured to limit current flow within the drain channel, wherein the forming at least two drain columns comprises:
depositing a first epitaxial layer of the second type on a substrate of the second type;
implanting impurities of the first type in the first epitaxial layer to define first portions of the drain columns and a first portion of a drain channel between the first portions of the drain columns;
depositing a second epitaxial layer of the second type on the first epitaxial layer; and
implanting impurities of the first type in the second epitaxial layer to define second portions of the drain columns, wherein the impurities implanted in the second epitaxial layer have a different characteristic than the impurities implanted in the first epitaxial layer.

34. The method of claim 33, wherein the different characteristic comprises a different dopant concentration.

35. The method of claim 34, wherein a dopant concentration of the impurities implanted in the second epitaxial layer is greater than a dopant concentration of impurities implanted in the first epitaxial layer.

36. The method of claim 33, wherein a dopant concentration of the second epitaxial layer is greater than a dopant concentration of the first epitaxial layer.

37. The method of claim 33, wherein the different characteristic comprises a different maximum lateral width of implanted impurities that defines a successive portion of a drain column.

38. The method of claim 37, wherein a maximum lateral width of impurities implanted in the first epitaxial layer to define the first portion of a drain column is greater than a maximum lateral width of impurities implanted in the second epitaxial layer to define the second portions of the drain column.

39. The method of claim 33, further comprising repeating the acts of depositing a second epitaxial layer and implanting impurities of the first type in the second epitaxial layer to create additional layers of the semiconductor structure.

* * * * *